United States Patent [19]

Akiyama et al.

[11] Patent Number: 5,126,229
[45] Date of Patent: Jun. 30, 1992

[54] PROCESS FOR PREPARING POSITIVE OR NEGATIVE LITHOGRAPHIC PRINTING PLATES USING A DEVELOPER HAVING AT LEAST ONE ALKALI-SOLUBLE MERCAPTO COMPOUND AND/OR THIOETHER COMPOUND

[75] Inventors: Keiji Akiyama; Hiroshi Misu, both of Shizuoka, Japan

[73] Assignee: Fuji Photo Film Co., Ltd., Minami-ashigara, Japan

[21] Appl. No.: 517,190

[22] Filed: May 1, 1990

Related U.S. Application Data

[62] Division of Ser. No. 339,717, Apr. 18, 1989.

Foreign Application Priority Data

[30]

Apr. 22, 1988 [JP] Japan ................... 63-99553

[51] Int. Cl.$^5$ ............... G03F 7/32; G03F 7/021; G03F 7/022
[52] U.S. Cl. ................... 430/302; 430/175; 430/176; 430/309; 430/326; 430/331; 430/325
[58] Field of Search ............ 430/331, 302, 309, 325, 430/326, 175, 176

[56] References Cited

U.S. PATENT DOCUMENTS

| | | | |
|---|---|---|---|
| 3,474,719 | 10/1969 | Levinos | 430/331 |
| 3,864,131 | 2/1975 | Tanaka et al. | 430/456 |
| 4,299,912 | 11/1981 | Shiba et al. | 430/302 |
| 4,361,639 | 11/1982 | Kanada et al. | 430/302 |
| 4,370,404 | 1/1983 | Tachikawa et al. | 430/302 |
| 4,467,027 | 8/1984 | Yamamoto et al. | 430/302 |

Primary Examiner—Charles L. Bowers, Jr.
Assistant Examiner—John S. Chu
Attorney, Agent, or Firm—Burns, Doane, Swecker & Mathis

[57] ABSTRACT

A developer composition comprises an aqueous alkaline solution which contains at least one alkali-soluble mercapto compound and/or thioether compound. The developer composition is excellent in developing properties and provides lithographic printing plates which do not cause background contamination of non-image areas during printing, when it is used in developing PS plates. It can be stored for a long time. The developer composition further makes it possible to develop both negative and positive working PS plates if its pH value is not less than 12.

27 Claims, No Drawings

PROCESS FOR PREPARING POSITIVE OR NEGATIVE LITHOGRAPHIC PRINTING PLATES USING A DEVELOPER HAVING AT LEAST ONE ALKALI-SOLUBLE MERCAPTO COMPOUND AND/OR THIOETHER COMPOUND

This application is a divisional, of application Ser. No. 07/339,717, filed Apr. 18, 1989.

BACKGROUND OF THE INVENTION

The present invention relates to a developer composition and more particularly to a developer composition suitable for removing from presensitized plates areas which are to be non-image portions of negative working and/or positive working lithographic printing plates.

Japanese Patent Publication for Opposition Purpose (hereinafter referred to as "J.P. KOKOKU") No. 56-39464 discloses a developer composition for removing un-exposed areas of a light-sensitive layer composed of a weak alkaline water-soluble organic polymer and a light-sensitive diazo resin. However, this developer composition does not show satisfactory ability of completely removing un-exposed portions of a light-sensitive layer adjacent to the surface of a substrate. For this reason, when the composition is used as a developer for a presensitized plate for making a lithographic printing plate (hereunder referred to as "PS plates"), background contamination is caused during printing operations. It has been known that such a disadvantage can be eliminated by adding a sulfite as disclosed in J.P. KOKOKU No. 56-42860 to the foregoing developer composition. Thus, the addition of such a reducing inorganic sulfite makes it possible to solve the problem of background contamination of the non-image areas during printing, but if the developer is stored for a long time period, a part of the sulfite is oxidized and thus the effect of preventing background contamination is impaired. On the other hand, as the developer in which hard water is used deteriorates, binders are precipitated out from the developer to form sludge. However, if a chelating agent (softening agent for hard water) is added thereto to prevent the formation of such sludge, the oxidation of sulfite is accelerated and in turn the deterioration of the developer is promoted.

PS plates having a positive working light-sensitive layer have also widely been used, like the negative working PS plates. However, a developer for such positive working PS plates generally differs from that for the negative working ones. Therefore, a plurality of developer compositions and a plurality of processing apparatuses are required for processing these two kinds of PS plates. This is economically unfavorable. Moreover, wide space is required for installing the apparatuses and thus workability is impaired.

SUMMARY OF THE INVENTION

Accordingly, an object of the present invention is to provide a developer composition which makes it possible to eliminate the foregoing drawbacks associated with the conventional developer composition. The developer composition is excellent in developing properties and provides lithographic printing plates which do not cause background contamination during printing when it is used to develop PS plates as well as it can be stored for a long time period.

Another object of the present invention is to provide a developer composition which can develop both negative working and positive working PS plates.

The inventors of this invention have conducted various studies to achieve the foregoing objects and have found that the foregoing objects can effectively be attained by substituting alkali-soluble organic compounds having specific functional groups for inorganic sulfites.

Moreover, the inventors have found that such a developer composition can develop light-sensitive materials having positive working light-sensitive layers composed of o-quinonediazide compounds and organic polymeric compounds if a pH of the developer composition is adjusted to not less than 12.

Consequently, the present invention provides a developer composition which comprises at least one alkali-soluble mercapto compound and/or thioether compound, at least one alkali agent and water.

DETAILED EXPLANATION OF THE INVENTION

The developer composition of the present invention will hereunder be explained in more detail.

The aforementioned alkali-soluble mercapto compounds and/or thioether compounds are preferably those having at least one mercapto group and/or thioether group and at least one acid residue. Moreover, the alkali-soluble mercapto compounds and/or thioether compounds are more preferably those having at least one mercapto group and/or thioether group and at least one carboxyl group.

Examples of such alkali-soluble mercapto compounds and/or thioether compounds used herein include mercaptoacetic acid, 2-mercaptopropionic acid, 3-mercaptopropionic acid, 4-mercaptobutanoic acid, 2,4-dimercaptobutanoic acid, 2-mercaptotetradecanoic acid, mercaptosuccinic acid, 2,3-dimercaptosuccinic acid, cysteine, N-acetyl cysteine, N-(2-mercaptopropionyl)-glycine, N-(2-mercapto-2-methylpropionyl)-glycine, N-(3-mercaptopropionyl)-glycine, N-(2-mercapto-2-methylpropionyl)-cysteine, penicillamine, N-acetyl penicillamine, glycine-cysteine-glutamine condensate, N-(2,3-dimercaptopropionyl)-glycine, 2-mercaptonicotinic acid, thiosalicylic acid, 3-mercaptobenzoic acid, 4-mercaptobenzoic acid, 3-carboxy-2-mercaptopyridine, 2-mercaptobenzothiazole-5-carboxylic acid, 2-mercapto-3-phenylpropenic acid, 2-mercapto-5-carboxyethylimidazole, 5-mercapto-1-(4-carboxyphenyl)-tetrazole, N-(3,5-dicarboxyphenyl)-2-mercaptotetrazole, 2-(1,2-dicarboxyethylthio)-5-mercapto-1,3,4-thiadiazole, 2-(5-mercapto-1,3,4-thiadiazolylthio)-hexanoic acid, 2-mercaptoethanesulfonic acid, 2,3-dimercapto-1-propanesulfonic acid, 2-mercaptobenzenesulfonic acid, 4-mercaptobenzenesulfonic acid, 3-mercapto-4-(2-sulfophenyl)-1,2,4-triazole, 2-mercaptobenzothiazole-5-sulfonic acid, 2-mercaptobenzimidazole-6-sulfonic acid, mercaptosuccinimide, 4-mercaptobenzenesulfonamide, 2-mercaptobenzimidazole-5-sulfonamide, 3-mercapto-4-(2-methylaminosulfonyl)-ethoxy)-toluene, 3-mercapto-4-(2-(methylsulfonylamino)-ethoxy)-toluene, 4-mercapto-N-(p-methylphenylsulfonyl)-benzamide, 4-mercaptophenol, 3-mercaptophenol, 2-mercaptophenol, 3,4-dimercaptotoluene, 2-mercaptohydroquinone, 2-thiouracil, 3-hydroxy-2-mercaptopyridine, 4-hydroxythiophenol, 4-hydroxy-2-mercaptopyrimidine, 4,6-dihydroxy-2-mercaptopyrimidine, 2,3-dihydroxypropylmercaptan, 2-mercapto-4-octyl phenyl methyl ether, 2-mercapto-4-octylphenyl methanesulfonylaminoethyl ether, 2-mercapto-4-octylphenyl methylaminosulfonylbutyl ether, thiodiglycolic acid, thiodiphenol, 6,8-dithiooctanoic acid, or alkali metal salts, alkaline earth metal salts or organic amine salts thereof. Particularly preferred are thiosalicylic acid, N-(2,3-dimercaptopropionyl)-glycine, 2-(1,2-dicarboxyethylthio)-5-mercapto-1,3,4-thiadiazole, N-(2-mercapto-2-methylpropionyl)-cysteine and cysteine.

These compounds may be used alone or in combination. Preferred amount thereof in the developer composition ranges from 0.001 to 10% by weight based on the total weight of the composition. This is because if it is less than 0.001% by weight, the desired ability thereof for preventing background contamination of non-image areas cannot be expected. While if the amount thereof is more than 10% by weight, mechanical strength of the photohardened portions of the light-sensitive layer is impaired. This in turn leads to the reduction in the printing durability of the resultant lithographic printing plates when the developer composition is applied to the development of PS plates.

Examples of alkaline agents for adjusting pH of the developer composition of the invention to a desired range include such an inorganic alkaline agent as sodium silicate, potassium silicate, potassium hydroxide, sodium hydroxide, lithium hydroxide, sodium tertiary phosphate, sodium secondary phosphate, ammonium tertiary phosphate, ammonium secondary phosphate, sodium metasilicate, sodium bicarbonate, sodium borate, ammonium borate or ammonia; and such an organic amine compound as monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, ethyleneimine, ethylenediamine or pyridine. These alkaline agents may be used alone or in combination.

Among these, particularly preferred are sodium silicate, potassium silicate, potassium hydroxide, sodium hydroxide, monoethanolamine, diethanolamine and triethanolamine and these compounds may be used alone or in combination.

The amount of these alkaline agents used in the developer composition of the invention ranges from 0.05 to 10% by weight and preferably 0.1 to 7% by weight based on the total weight of the composition.

The developer composition of the invention may further comprise anionic surfactants and/or organic solvents according to need. Examples of such anionic surfactants include higher alcohol (8 to 22 carbon atoms) sulfuric acid ester salts such as sodium salt of lauryl alcohol sulfate, sodium salt of octyl alcohol sulfate and ammonium salt of lauryl alcohol sulfate; aliphatic alcohol phosphoric acid ester salts such as sodium salt of cetyl alcohol phosphoric acid ester; alkylarylsulfonic acid salts such as sodium dodecylbenzenesulfonic acid, sodium isopropylnaphthalenesulfonic acid and sodium metanitrobenzenesulfonic acid; sulfonic acid salts of alkylamides such as $C_{17}H_{33}CON(CH_3)CH_2CH_2SO_3Na$; and sulfonic acid salts of dibasic fatty acid esters such as sodium dioctylsulfosuccinate and sodium dihexyl sulfosuccinate. These surfactants may be used alone or in combination.

These surfactants are preferably added to the developer composition so that the amount thereof in the developer practically used ranges from 0.1 to 5% by weight on the basis of the total weight of the developer. This is because if the amount of the surfactant is less than 0.1% by weight, the desired effects cannot be achieved, while if it is more than 5% by weight, there are encountered adverse effects such as excessive dissolving out of dyes (so-called color separation) included in a photohardenable light-sensitive solution from the photohardened portion thereof and lowering of mechanical and chemical strength of the photohardened images such as wear resistance thereof.

Suitable organic solvents are those having solubility in water of not more than about 10% by weight, preferably not more than 5% by weight. Specific examples thereof include 1-phenylethanol, 2-phenylethanol, 3-phenylpropanol-1; 4-phenylbutanol-1; 4-phenylbutanol-2; 2-phenylbutanol-1; 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol. These organic solvents may be used alone or in combination.

The organic solvent is suitably added to the developer composition so that the amount thereof in the developer practically used ranges from 1 to 5% by weight on the basis of the total weight of the developer. The amount of the organic solvents closely correlates with that of the surfactants. In other words, it is preferred to increase the amount of the surfactants as the amount of the organic solvents increases. This is because if the amount of the anionic surfactant is small and that of the organic solvent is great, the organic solvent cannot be dissolved in the developer composition and, therefore, good developing properties of the developer composition cannot be expected.

The developer composition of the invention may further comprise other additives such as antifoaming agents and softening agents for hard water according to need. Specific examples of such softening agents for hard water include such polyphosphoric acid salts as $Na_2P_2O_7$, $Na_5P_3O_3$, $Na_3P_3O_9$, $Na_2O_4P(NaO_3P)PO_3$-$Na_2$, Calgon (trade name of sodium polymetaphosphate); and such aminopolycarboxylic acids and salts thereof as ethylenediaminetetraacetic acid and potassium and sodium salts thereof, diethylenetriaminepentaacetic acid and potassium and sodium salts thereof, triethylenetetraminehexaacetic acid and potassium and sodium salts thereof, hydroxyethylethylenediaminetriacetic acid and potassium and sodium salts thereof, nitrilotriacetic acid and potassium and sodium salts thereof, 1,2-diaminocyclohexanetetraacetic acid and potassium and sodium salts thereof and 1,3-diamino-2-propanoltetraacetic acid and potassium and sodium salts thereof. These softening agents may be used alone or in combination.

The optimum amount of these softening agents vary depending on the hardness and the amount of the hard water employed, but in general they are used in the developer composition so that the amount thereof used in the developer practically used ranges from 0.01 to 5% by weight, preferably 0.01 to 0.5% by weight on the basis of the total weight of the developer.

The light-sensitive materials developed with the developer composition of the invention may optionally be subjected to desensitization treatment directly or after washing with water; or a treatment with an aqueous solution containing an acid; or a desensitization treatment after the treatment with an aqueous solution containing an acid. Moreover, the throughput capacity of the developer for such a PS plate is lowered since the alkaline aqueous solution is consumed proportional to the amount of the processed PS plates or the concentration of alkali is reduced due to the absorption of air if an automatic developing machine is operated for a long period. In such cases, the throughput capacity of the developer may be regenerated by adding a replenisher thereto as disclosed in J.P. KOKAI No. 54-62004 (U.S. Pat. No. 4,259,434).

Examples of light-sensitive diazo resins contained in the light-sensitive layers which are developed with the composition of the invention are those obtained by making the resins disclosed in U.S. Pat. Nos. 2,679,498; 3,050,502; 3,163,633 and 3,406,159 and J.P. KOKOKU Nos. 49-48001 (B.P. 1,312,925) and 49-45322 (U.S. Pat. No. 3,679,419) substantially water-insoluble and organic solvent-soluble in the manner as disclosed in J.P. KOKOKU No. 47-1167, U.S. Pat. No. 3,300,309, J.P. KOKAI Nos. 54-98613, 56-121031, 59-78340, 59-22834 and 63-262643. In other words, the light-sensitive diazo resins are first synthesized in the form of inorganic salts such as zinc chloride complex salts and then the salts are converted to those with organic compounds having either phenolic hydroxyl or sulfonic acid residue or both of these; or hexafluorophosphates, tetrafluoroborates or complex salts thereof to obtain water-insoluble diazo resins.

A variety of hydrophobic resins which may be used in combination with such a substantially water-insoluble diazo resin have been generally known in the art and widely used. The judgement on whether such a resin is favorable in the invention or not greatly relies on the requirements of each technique for making lithographic printing plates. Of course, the resin must be oleophilic to impart sufficient ink receptivity to the plate, it should be soluble in usual organic solvents and physically or chemically compatible with a light-sensitive diazo resin which is hardly soluble or completely insoluble in water and it must have film-forming properties. The resin must be excellent in affinity to an ink to thus serve as the substrate for forming an ink film and it must a hardness in some degree, elasticity and flexibility to bear abrasion during printing and to thus provide several tens of thousands to several hundreds of thousands of printed matters.

As resins which satisfy the foregoing requirements, there may be mentioned, for instance, epoxy resins, polyamide resins, halogenated vinyl resins, in particular polyvinyl chloride, polyvinylidene chloride, chlorinated polyolefins, polyvinyl acetate, acetal resins such as formal resins and butyral resins, alkali-soluble urethane resins such as those available from U.S. GOODRICH Company under the trade name of ESTANE, styrene-maleic anhydride copolymer and half esters and half amides thereof, cellulose derivatives, shellac, rosin or modified products thereof, acrylic acid-acrylate copolymers, multicomponent copolymer of 2-hydroxyethyl (meth)acrylate, (meth) acrylonitrile, (meth)acrylic acid and optionally other copolymerizable monomers as disclosed in J.P. KOKAI No. 50-118802 (U.S. Pat. No. 4,123,276); multicomponent copolymers of (meth)acrylic acid whose terminal group is hydroxyl group and which is esterified with a group having dicarboxylic acid ester residues, (meth)acrylic acid and optionally other copolymerizable monomers as disclosed in J.P. KOKAI No. 53-120903; multicomponent copolymers of a monomer having aromatic hydroxyl group such as N-(4-hydroxyphenyl)-methacrylamide, (meth) acrylic acid and optionally other copolymerizable monomers as disclosed in J.P. KOKAI No. 54-98614; and multicomponent copolymers of an alkyl acrylate, (meth)acrylonitrile and an unsaturated carboxylic acid as disclosed in J.P. KOKAI No. 56-4144. In addition to these examples, acidic polyvinyl alcohol derivatives, acidic cellulose derivatives and polymeric compounds obtained by making polyvinylacetal or polyurethane alkali-soluble, as disclosed in J.P. KOKOKU No. 54-19773 (U.S. Pat. No. 3,732,105) and J.P. KOKAI Nos. 57-94747 (U.S. Pat. No. 4,387,151), 60-182437 (U.S. Pat. No. 4,631,245), 62-58242 and 62-123453 (B.P.2,185,120) are also preferably used in the invention.

The foregoing water-insoluble diazo resin and the hydrophobic resin are dissolved in a proper solvent such as a lower alcohol, glycol ether, a dialkylformamide, a chlorinated solvent or a combination thereof. The solution is optionally dyed with a dye or a pigment and further comprises optionally other components such as agents or compositions for obtaining a visible image immediately after imagewise exposure, plasticizers and stabilizers.

The foregoing photohardenable light-sensitive layer may be applied to a variety of substrates depending on purposes. Examples of such substrates are paper, paper laminated with a plastic sheet such as a polyethylene, polypropylene or polystyrene sheet; metal plates such as aluminum (inclusive of aluminum alloys), zinc and copper plates; plastic films such as cellulose diacetate, cellulose triacetate, cellulose propionate, cellulose nitrate, cellulose acetate butyrate, cellulose butyrate, polyethylene terephthalate, polyethylene, polypropylene, polystyrene, polycarbonate and polyvinyl acetal films; and paper or plastic films which are laminated with a foil of the foregoing metal or to which a film of such a metal is deposited. In particular, when PS plates are prepared, a metal plate such as aluminum plate is preferred as a substrate. The surface of the aluminum plate is preferably subjected to a treatment with an aqueous solution of an alkali metal silicate after a treatment with an aqueous solution of an alkali metal silicate as disclosed in U.S. Pat. No. 2,714,066 and anodizing as disclosed in U.S. Pat. No. 3,181,461. The foregoing light-sensitive layer is applied to the surface of the aluminum plate thus treated in an amount ranging from 0.1 to 7 $g/m^2$, preferably 0.2 to 5 $g/m^2$ to thus form PS plates.

Examples of the positive working light-sensitive layers to which the developer composition of the invention is applied include those conventionally known as positive working light-sensitive compositions. Particularly preferred are those composed of o-quinonediazide compounds and phenolic resins.

Such o-quinonediazide compounds are those which have at least one o-quinonediazide group and whose solubility in alkali is increased by exposing it to actinic rays. A variety of such compounds having various structures may be used in the invention. These o-quinonediazide compounds are detailed in J. Koser, "Light-sensitive Systems", pp. 339-352, issued by John Wiley & Sons, Inc. Particularly preferred are sulfonic acid ester or sulfonamide of o-quinonediazide obtained by reacting the latter with various aromatic polyhydroxy compounds or aromatic amine compounds.

Among o-quinonediazide compounds, most preferred are esters of benzoquinone-(1,2)-diazidesulfonic acid chloride or naphthoquinone-(1,2)-diazidesulfonic acid chloride with pyrogallol-acetone resin as disclosed in J.P. KOKOKU No. 43-28403(U.S. Pat. No. 3,635,709). Examples of preferred o-quinonediazide compounds are esters of benzoquinone-(1,2)-diazidesulfonic acid chloride or naphthoquinone-(1,2)-diazidesulfonic acid chloride with phenol-formaldehyde resin as disclosed in U.S. Pat. Nos. 3,046,120 and 3,188,210.

Besides, other useful o-quinonediazide compounds are reported in a variety of patents and have been known in the art. These compounds may also be used in the invention. For instance, there may be mentioned such o-quinonediazide compounds as those disclosed in J.P. KOKAI Nos. 47-5303, 48-63802, 48-63803, 48-96575, 49-38701 and 48-13354; J.P. KOKOKU Nos. 41-11222, 45-9610 and 49-17481; U.S. Pat. Nos. 2,797,213, 3,454,400, 3,544,323, 3,573,917, 3,674,495 and 3,785,825; U.K. Patent Nos. 1,227,602, 1,251,345, 1,267,005, 1,329,888 and 1,330,932 and German Patent No. 854,890.

In the positive working light-sensitive compositions, these o-quinonediazide compounds may be used alone, but preferably in combination with a binder. Examples of preferred binders include aqueous alkaline solution-soluble novolak resins. Typical examples of such novolak resins are phenol-formaldehyde resin, cresolformaldehyde resin, phenol-cresol-formaldehye resin, p-t-butylphenolformaldehyde resin and xylene resin modified with phenol. Examples of other novolak resins are polyvinyl compounds having phenolic hydroxyl groups such as polyhydroxystyrene polymers and copolymers thereof and halogenated polyhydroxystyrene polymers and copolymers thereof.

The amount of these o-quinonediazide compounds ranges from 10 to 50% by weight, preferably 20 to 40% by weight on the basis of the total weight of the composition. On the other hand, the amount of the phenolic resins to be incorporated into the composition ranges from 45 to 80% by weight and preferably 50 to 70% by weight on the basis of the total weight of the composition.

The positive working light-sensitive composition may further comprise fillers, dyestuffs, dyes, pigments, agents capable of causing degradation by light to generate an acid such as 1,2-naphthoquionone-(2)-4-sulfonic acid chloride, fluorine type surfactants for improving coating properties of the composition, and other commonly used additives and auxiliary agents. The amount of these additives varies depending on the kinds thereof, but in general it desirably ranges from 0.01 to 20% by weight, preferably 0.05 to 10% by weight based on the total weight of the light-sensitive composition.

In order to prepare lithographic printing plates by applying such a positive working light-sensitive layer onto the surface of a substrate, desired amounts of the foregoing diazo resin, binder and additives are dissolved in a proper solvent to prepare a light-sensitive solution, the resultant solution is applied to the surface of a substrate and then is dried. The coated amount of the light-sensitive layer ranges from 0.1 to 7 g/m$^2$, preferably 0.2 to 5 g/m$^2$. Examples of substrates to which the positive working light-sensitive layer is applied are the same as those listed above in connection with the negative working light-sensitive layer.

The lithographic printing plates obtained by imagewise exposing a negative working PS plate using a light source rich in ultraviolet rays such as a metal halide lamp and developing it with the developer composition of the present invention can always provide printed matters free of background contamination. In addition, if a pH value of the developer of this invention is not less than 12, positive working PS plates likewise imagewise exposed to light can be developed with the developer of this invention and the resulting lithographic printing plates likewise provide good printed matters.

As explained above, the developer composition whose pH is adjusted to not less than 12 according to the invention makes it possible to process both negative working and positive working PS plates. Therefore, it is not necessary to previously prepare two kinds of developer compositions or two developing apparatuses, this leads to substantial improvement of working efficiency and reduction of initial investments and space for installing such apparatuses.

The present invention will hereunder be explained in more detail with reference to the following non-limitative working Examples and further the effects practically achieved will also be discussed in comparison with Comparative Examples.

EXAMPLE 1

Ethylene glycol monomethyl ether (300 g) was heated to 100° C. under nitrogen gas stream and a mixed solution composed of 70 g of 2-hydroxyethyl methacrylate, 80 g of acrylonitrile, 130 g of benzyl methacrylate, 20 g of methacrylic acid and 1.2 g of benzoyl peroxide was dropwise added thereto over 2 hours. After the completion of the dropwise addition, 300 g of ethylene glycol monomethyl ether and 0.3 g of benzoyl peroxide were added and the reaction was continued for 4 hours. After the completion of the reaction, the reaction solution was diluted with methanol and poured into water to precipitate the resultant copolymer followed by drying the precipitates at 70° C. The acid value of the 2-hydroxyethyl methacrylate copolymer (I) was 40.2.

A 2 S aluminum plate of 0.15 mm thick was immersed in 10% aqueous solution of sodium tertiary phosphate maintained at 80° C. for 3 minutes to degrease followed by graining with a nylon brush and a slurry of pumice stone as an abrasive and desmutting using 3% aqueous solution of sodium aluminate maintained at 60° C. The aluminum plate was anodized at a current density of 2 A/dm$^2$, in 20% sulfuric acid solution for 2 minutes and then treated with 2.5% aqueous solution of sodium silicate maintained at 70° C. for one minutes.

A PS plate was prepared by applying a light-sensitive solution having the following composition onto the surface of the aluminum plate and drying it for 2 minutes.

| Light-sensitive Solution | |
|---|---|
| Components | Amount (g) |
| 2-Hydroxyethyl methacrylate copolymer (I) | 87 |
| 2-Methoxy-4-hydroxy-5-benzoylbenzenesulfonic acid salt of the condensate of p-diazodiphenylamine and paraformaldehyde | 10 |
| Oil Blue #603 (available from ORIENT CHEMICAL INDUSTRIES, LTD.; triphenylmethane type oil-soluble dye) | 3 |
| 2-Methoxyethanol | 600 |
| Methanol | 600 |
| Ethylene dichloride | 600 |

The coated amount of the light-sensitive solution (weighed after drying) was 2.5 g/m$^2$. A negative original transparency was placed in close contact with the PS plate thus prepared, the plate was imagewise exposed, for 40 seconds, to light from a 30 A carbon arc lamp disposed at a distance 70 cm from the plate and the imagewise exposed PS plate was developed with the developers listed in Table I utilizing an automatic developing machine 800 H (available from Fuji Photo Film Co., Ltd.). The results obtained are listed in Table II given below.

TABLE I

|  | Comp. Ex. 1 | Comp. Ex. 2 | Ex. 1 |
| --- | --- | --- | --- |
| Sodium alkylnaphtha-lene-sulfonate (available from Kao Atlas Co., Ltd. under the trade name of Pelex NBL) | 30 g | 30 g | 30 g |
| Benzyl alcohol | 30 g | 30 g | 30 g |
| Triethanolamine | 20 g | 20 g | 20 g |
| Monoethanolamine | 4 g | 4 g | 4 g |
| Nitrilotriacetic acid | 0.1 g | 0.1 g | 0.1 g |
| Potassium sulfite | 0 | 3 g | 0 |
| Thiosalicylic acid | 0 | 0 | 3 g |
| Water to | 1000 ml | 1000 ml | 1000 ml |
| pH | 10.5 | 10.5 | 10.3 |

TABLE II

| Kind of Developer | Storage Time of Developer | Background Contamination of Non-image Area | |
| --- | --- | --- | --- |
| | | zero | Storage Time of the Plate Forced Aging (at 60° C.: for 3 days) |
| Comp. Ex. 1 | 0 | C | D |
| | one year | D | D |
| Comp. Ex. 2 | 0 | A | A |
| | one year | B | C |
| Ex. 1 | 0 | A | A |
| | one year | A | A |

A: not contaminated.
B: slightly contaminated if the amount of dampening water is reduced.
C: slightly contaminated.
D: severely contaminated.
Storage Time of the Plate: A PS plate was stored at 60° C. for 3 days and then was imagewise exposed to light and was developed.

As seen from the results listed in Table II, if the developer composition containing thiosalicylic acid was used, background contamination during printing was not observed even when either or both of the developer and the PS plate were used after they had been stored for a long period.

EXAMPLES 2 AND 3

To the surface of the aluminum plate used in Example 1, there was applied a light-sensitive solution comprising 10 g of hexafluorophosphate of a condensate of p-diazodiphenylamine and paraformaldehyde (conversion to $PF_6$ salt: 89%), 90 g of a 2-hydroxyethyl methacrylate/acrylonitrile/ethyl methacrylate/methacrylic acid (monomer charge weight ratio=50/26/20/4% by weight) copolymer, 1 g of sodium isopropylnaphthalenesulfonate, 2 g of phosphorous acid, 3 g of Victoria Pure Blue BOH (available from HODOGAYA CHEMICAL CO., LTD.), 7 g of tricresyl phosphate, 600 g of ethylene glycol monomethyl ether, 600 g of methanol and 600 g of ethylene dichloride. The coated amount weighed after drying was 1.5 g/m². The resultant PS plate was imagewise exposed to light and then was developed with developers listed in Table III utilizing an automatic developing machine 800 U (available from Fuji Photo Film Co., Ltd.). Results summarized in Table III were obtained. In this connection, each developer had been force-heated at 60° C. for one week after force-blowing oxygen into the developer. These developer were diluted to 1:10 (volume ratio) prior to use the same.

TABLE III

| | Composition of Developers (g) | | |
| --- | --- | --- | --- |
| Component | Comp. Ex. 3 | Ex. 2 | Ex. 3 |
| Benzyl alcohol | 900 | 900 | 900 |
| Triethanolamine | 300 | 300 | 300 |
| Monoethanolamine | 20 | 20 | 20 |
| 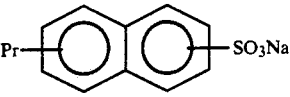 | 300 | 300 | 300 |
| Pure water | 600 | 600 | 600 |
| Mercapto compound | none | (a) | (b) |
| EDTA (ethylenediaminetetraacetic acid) | 1 | 1 | 1 |
| pH | 10.5 | 10.3 | 10.3 |
| Background Contamination of Non-image Area During Printing | C | A | A |

(a) $HSCH_2CH(SH)CONHCH_2COOH$
(b) 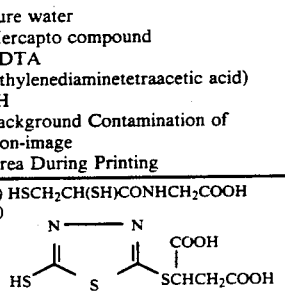

EXAMPLE 4

An aluminum plate of 0.3 mm thick (material: 1050) was washed with trichlene to degrease the surface thereof, which was then grained with a nylon brush and an aqueous suspension of pumice stone and then was sufficiently washed with water. The plate was immersed in 25% aqueous sodium hydroxide solution maintained at 45° C. for 9 seconds to etch it, washed with water, and then was immersed in 20% nitric acid solution for 20 seconds followed by washing with water. The etching was performed so that the amount of the grained surface which was removed by the etching was equal to about 3 g/m². The plate was then anodized at a current density of 15 A/dm², in 7% sulfuric acid solution as an electrolyte so as to form 3 g/m² of a direct current anodized film followed by washing with water and drying. Then, a light-sensitive solution having the following composition was applied to the surface of the plate and was dried at 100° C. for 2 minutes to obtain a positive working PS plate. The coated amount of the light-sensitive solution weighed after drying was 2.4 to 2.5 g/m².

| Light-Sensitive Solution | |
| --- | --- |
| Component | Amount (g) |
| Ester compound of naphthoquinone-1,2-diazido-5-sulfonic acid chloride and pyrogallol-acetone resin (note 1) | 0.90 |
| Cresol-formaldehyde resin | 1.70 |
| t-Butylphenol-formaldehyde resin (note 2) | 0.05 |
| Naphthoquinone-1,2-diazido-4-sulfonic acid chloride | 0.03 |
| Tetrahydrophthalic anhydride | 0.20 |
| Oil Blue #603 (ORIENT CHEMICAL INDUSTRIES, LTD.; blue dye) | 0.05 |
| Methyl ethyl ketone | 8 |
| Ethylene glycol monomethyl ether | 15 |

Note 1:
Compound disclosed in Example 1 of U.S. Pat. No. 3,635,709.
Note 2:
Resin disclosed in the specification of U.S. Pat. No. 4,123,279.

The positive working PS plate was imagewise exposed to light from a metal halide lamp (1.5 KW) disposed at a distance of 70 cm therefrom and then was developed with developers (a) and (b) utilizing an automatic developing machine 800 EII (available from Fuji Photo Film Co., Ltd.). As a result, lithographic printing plates from which the un-exposed portions were completely dissolved and removed were obtained. In particular, when the developer (a) was used, there was not observed a coupling between the decomposed o-quinonediazide and non-decomposed o-quinonediazide and scumming of the substrate due to the residual light-sensitive material, even if the PS plates were processed in an amount of about 2 m²/l. Thus, good printed matters free of background contamination were provided. However, when the developer (b) was used, such coupling was caused and it was needed to eliminate the film edge portions.

In addition, the lithographic printing plate obtained by developing the negative working PS plate used in Example 1 with the developer (a) did not cause background contamination. On the contrary, when it was developed with the developer (b), the resultant lithographic printing plate caused contamination. As detailed above, the use of the developer composition of the present invention made it possible to process negative and positive working PS plates with the same developer and in the same automatic developing machine.

TABLE IV

|  | Ex. 4 (developer a) | Comp. Ex. 4 (developer b) |
|---|---|---|
| Pelex NBL (38% aqueous solution; available from Kao Atlas Co., Ltd.) | 10 g | 10 g |
| Thiosalicylic acid/thioglycolic acid | 0.15/0.15 (g) | 0 |
| pH | 12.9 | 13.1 |

*The foregoing compounds were added to one liter of a developer comprising an aqueous solution of sodium silicate (molar ratio, $SiO_2/K_2O$ = 1.2; pH = 13) having a concentration of 2.5% by weight.

What is claimed is:
1. A process for preparing a lithographic printing plate comprising the steps of:
 (i) imagewise exposing to light a presensitized plate comprising a substrate having thereon a negative working light-sensitive layer containing a diazo resin; and
 (ii) developing the imagewise light-exposed presensitized plate with a developer composition comprising at least one alkali-soluble mercapto compound and/or thioether compound, at least one alkali agent and water to remove unexposed areas of the imagewise light-exposed light-sensitive layer.

2. A process according to claim 1 wherein the pH of the aqueous alkali solution is not less than 12.

3. A process according to claim 1 wherein the alkali-soluble mercapto compound and/or thioether compound are selected from the group consisting of those having at least one mercapto group and/or thioether group and at least one acid group.

4. A process according to claim 1 wherein the alkali-soluble mercapto compound and/or thioether compound are selected from the group consisting of those having at least one mercapto group and/or thioether group and at least one carboxyl group.

5. A process according to claim 1 wherein the alkali-soluble mercapto compound and/or thioether compound are selected from the group consisting of mercaptoacetic acid, 2-mercaptopropionic acid, 3-mercaptopropionic acid, 4-mercaptobutanoic acid, 2,4-dimercaptobutanoic acid, 2-mercaptotetradecanoic acid, mercaptosuccinic acid, 2,3-dimercaptosuccinic acid, cysteine, N-acetyl cysteine, N-(2-mercaptopropionyl)-glycine, N-(2-mercapto-2-methylpropionyl)-glycine, N-(3-mercaptopropionyl)-glycine, N-(2-mercapto-2-methylpropionyl)-cysteine, penicillamine, N-acetyl penicillamine, glycine-cysteineglutamine condensate, N-(2,3-dimercaptopropionyl)-glycine, 2-mercaptonicotinic acid, thiosalicylic acid, 3-mercaptobenzoic acid, 4-mercaptobenzoic acid, 3-carboxy-2-mercaptopyridine, 2-mercaptobenzothiazole-5-carboxylic acid, 2-mercapto-3-phenylpropenic acid, 2-mercapto-5-carboxyethylimidazole, 5-mercapto-1-(4-carboxyphenyl)-tetrazole, N-(3,5-dicarboxyphenyl)-2-mercaptotetrazole, 2-(1,2-dicarboxyethylthio)-5-mercapto-1,3,4-thiadiazole, 2-(5-mercapto-1,3,4-thiadiazolylthio)-hexanoic acid, 2-mercaptoethanesulfonic acid, 2,3-dimercapto-1-propanesulfonic acid, 2-mercaptobenzenesulfonic acid, 4-mercaptobenzenesulfonic acid, 3-mercapto-4-(2-sulfophenyl)-1,2,4-triazole, 2-mercaptobenzothiazole-5-sulfonic acid, 2-mercaptobenzimidazole-6-sulfonic acid, mercaptosuccinimide, 4-mercaptobenzenesulfonamide, 2-mercaptobenzimidazole-5-sulfonamide, 3-mercapto-4-(2-methylaminosulfonyl)ethoxy)-toluene, 3-mercapto-4-(2-(methylsulfonylamino)-ethoxy)-toluene, 4-mercapto-N-(p-methylphenylsulfonyl)-benzamide, 4-mercaptophenol, 3-mercaptophenol, 2-mercaptophenol, 3,4-dimercaptotoluene, 2-mercaptohydroquinone, 2-thiouracil, 3-hydroxy-2-mercaptopyridine, 4-hydroxythiophenol, 4-hydroxy-2-mercaptopyrimidine, 4,6-dihydroxy-2-mercaptopyrimidine, 2,3-dihydroxypropylmercaptan, 2-mercapto-4-octylphenyl ether methyl ether, 2-mercapto-4-octylphenol methanesulfonylaminoethyl ether, 2-mercapto-4-octylphenol methylaminosulfonylbutyl ether, thiodiglycolic acid, thiodiphenol, 6,8-dithiooctanoic acid, or alkali metal salts, alkaline earth metal salts or organic amine salts thereof.

6. A process according to claim 5 wherein the alkalisoluble mercapto compound and/or thioether compound are selected from the group consisting of thiosalicylic acid, N-(2,3-dimercaptopropionyl)-glycine, 2-(1,2-dicarboxyethylthio)-5-mercapto-1,3,4-thiadiazole, N-(2-mercapto-2-methylpropionyl)-cysteine and cysteine.

7. A process according to claim 1 wherein the amount of the alkali-soluble mercapto compound and/or thioether compound ranges from 0.001 to 10% by weight on the basis of the total weight of the composition.

8. A process according to claim 1 wherein the alkali agent is selected from the group consisting of sodium silicate, potassium silicate, potassium hydroxide, sodium hydroxide, lithium hydroxide, sodium tertiary phosphate, sodium secondary phosphate, ammonium tertiary phosphate, ammonium secondary phosphate, sodium metasilicate, sodium bicarbonate, sodium borate, ammonium borate, ammonia, monomethyl-amine, dimethylamine, trimethylamine, monoethylamine, diethylamine, triethylamine, monisopropylamine, diisopropylamine, n-butylamine, monoethanolamine, diethanolamine, triethanolamine, monoisopropanolamine, diisopropanolamine, ethyleneimine, ethylenediamine and pyridine.

9. A process according to claim 8 wherein the alkali agent is selected from the group consisting of sodium silicate, potassium silicate, potassium hydroxide, sodium hydroxide, monoethanolamine, diethanolamine and triethanolamine.

10. A process according to claim 8 wherein the amount of the alkali agent in the developer compostion ranges from 0.05 to 10% by weight on the basis of the total weight of the composition.

11. A process according to claim 10 wherein the amount of the alkali agent in the developer composition ranges from 0.1 to 7% by weight on the basis of the total weight of the composition.

12. A process according to claim 1 wherein the developer further comprises at least one anionic surfactant which is selected from the group consisting of $C_8$ to $C_{22}$ higher alcohol sulfuric acid ester salts, aliphatic alcohol phosphoric acid ester salts, alkylarylsulfonic acid salts, sulfonic acid salts of alkylamides, sulfonic acid salts of dibasic fatty acid esters.

13. A process according to claim 12 wherein the anionic surfactant is selected from the group consisting of sodium salt of lauryl alcohol sulfate, sodium salt of octyl alcohol sulfate, ammonium salt of lauryl alcohol sulfate, sodium salt of cetyl alcohol phosphoric acid ester, sodium dodecylbenzenesulfonic acid, sodium isopropylnaphthalenesulfonic acid, sodium metanitrobenzenesulfonic acid, $C_{17}H_{33}CON(CH_3)CH_2CH_2SO_3Na$, sodium dioctylsulfosuccinate and sodium dihexyl sulfosuccinate.

14. A process according to claim 12 wherein the anionic surfactant is added to the developer composition so that the amount thereof in the developer practically used ranges from 0.1 to 5% by weight on the basis of the total weight of the developer.

15. A process according to claim 1 wherein the developer further comprises at least one organic solvent having solubility in water of not more than about 10% by weight.

16. A process according to claim 15 wherein the organic solvent has a solubility in water of not more than 5% by weight.

17. A process according to claim 15 wherein the organic solvent is at least one member selected from the group consisting of 1-phenylethanol, 2-phenylethanol, 3-phenylpropanol-1; 4-phenylbutanol-1; 4-phenylbutanol-2; 2-phenylbutanol-1-; 2-phenoxyethanol, 2-benzyloxyethanol, 0-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol.

18. A process according to claim 15 wherein the organic solvent is added to the developer composition so that the amount thereof in the developer ranges from 1 to 5% by weight on the basis of the total weight of the developer.

19. a process according to claim 1 wherein the developer further comprises antifoaming agents and/or softening agents for hard water.

20. A process according to claim 19 wherein the softening agent is added to the developer composition so that the amount thereof in the developer ranges from 0.01 to 5% by weight on the basis of the total weight of the developer.

21. A process for developing a presensitized plate which comprises the steps of:
(i) developing an imagewise light-exposed, positive working, presensitized plate having a substrate with an imagewise light-exposed positive working light-sensitive layer containing an 0-quinone diazide compound with a developer composition to remove light-exposed areas of the positive working light-sensitive layer, to provide a lithographic printing layer, or (ii) developing an imagewise light-exposed, negative working, presensitized plate having a substrate with an imagewise light-exposed negative working light-sensitive layer containing a diazo resin with a developer composition to remove light-unexposed areas of the negative working light-sensitive layer, to provide a lithographic printing layer, said developer composition for the positive working presensitized plate and said developer composition for the negative working presensitized plate, each comprising at least one alkali-soluble mercapto compound and/or thioether compound, at least one alkali agent and water, and having a pH of not less than 12.

22. A process according to claim 21 wherein the alkali-soluble mercapto compound and/or thioether compound are selected from the group consisting of mercaptoacetic acid, 2-mercaptopropionic acid, 3-mercaptopropionic acid, 4-mercaptobutanoic acid, 2,4-dimercaptobutanoic acid, 2-mercaptotetradecanoic acid, mercaptosuccinic acid, 2,3-dimercaptosuccinic acid, cysteine, N-acetyl cysteine, N-(2-mercaptopropionyl)-glycine, N-(2-mercapto-2-methylpropionyl)-glycine, N-(3-mercaptopropionyl)-glycine, N-(2-mercapto-2-methylpropionyl)-cysteine, penicillamine, N-acetyl penicillamine, glycine-cysteine-glutamine condensate, N-2,3-dimercaptopropionyl)-glycine, 2-mercaptonicotinic acid, thiosalicylic acid, 3-mercaptobenzoic acid, 4-mercaptobenzoic acid, 3-carboxy-2-mercaptopyridine, 2-mercaptobenzothiazole-5-carboxylic acid, 2-mercapto-3-phenylpropenic acid, 2-mercapto-5-carboxyethylimidazole, 5-mercapto-1-(4-carboxyphenyl)-tetrazole, N-(3,5-dicarboxyphenyl)-2-mercaptotetrazole, 2-(1,2-dicarboxyethylthio)-5-mercapto-1,3,4-thiadiazole, 2-(5-mercapto-1,3,4-thiadiazolylthio)-hexanoic acid, 2-mercaptoethanesulfonic acid, 2,3-dimercapto-1-propanesulfonic acid, 2-mercaptobenzenesulfonic acid, 4-mercaptobenzenesulfonic acid, 3-mercapto-4-(2-sulfophenyl)-1,2,4-triazole, 2-mercaptobenzothiazole-5-sulfonic acid, 2-mercaptobenzimidazole-6-sulfonic acid, mercaptosuccinimide, 4-mercaptobenzenesulfonamide, 2-mercaptobenzimidazole-5-sulfonamide, 3-mercapto-4-(2-methylaminosulfonyl)-ethoxy) -toluene, 3-mercapto-4-(2-(methylsulfonylamino)-ethoxy)-toluene, 4-mercapto-N-(p-methylphenylsulfonyl)-benzamide, 4-mercaptophenol, 3-mercaptophenol, 2-mercaptophenol, 3,4-dimercaptotoluene, 2-mercaptohydroquinone, 2-thiouracil, 3-hydroxy-2-mercaptopyridine, 4-hydroxythiophenol, 4-hydroxy-2-mercaptopyrimidine, 4,6-dihydroxy-2-mercaptopyrimidine, 2,3-dihydroxypropylmercaptan, 2-mercapto-4-octylphenyl ether methyl ether, 2-mercapto-4-octylphenol methanesulfonylaminoethyl ether, 2-mercapto-4-octylphenol methylaminosulfonylbutyl ether, thiodiglycolic acid, thiodiphenol, 6,8-dithioctanoic acid, or alkali metal salts, alkaline earth metal salts or organic amine salts thereof.

23. A process according to claim 21 wherein the alkali agent is selected from the group consisting of sodium silicate, potassium silicate, potassium hydroxide, sodium hydroxide, monoethanolamine, diethanolamine and triethanolamine.

24. A process according to claim 21 wherein the developer further comprises at least one anionic surfactant which is selected from the group consisting of $C_8$ to $C_{22}$ higher alcohol sulfuric acid ester salts, aliphatic alcohol phosphoric acid ester salts, alkylarylsulfonic acid salts, sulfonic acid salts of alkylamides, sulfonic acid salts of dibasic fatty acid esters.

25. A process according to claim 21 wherein the developer further comprises at least one organic solvent having solubility in water of not more than about 10% by weight.

26. A process according to claim 1, wherein the developer composition contains the alkali-soluble thioether compound.

27. A process according to claim 21, wherein the developer composition contains the alkali-soluble thioether compound.

* * * * *